(12) United States Patent
Joo et al.

(10) Patent No.: US 12,155,959 B2
(45) Date of Patent: Nov. 26, 2024

(54) DISPLAY APPARATUS WHICH MAY BE POWERED BY WIRELESS POWER TRANSFER

(71) Applicant: SAMSUNG ELECTRONICS CO., LTD., Suwon-si (KR)

(72) Inventors: Sungyong Joo, Suwon-si (KR); Taehyuck Kim, Suwon-si (KR); Youngchan Park, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 281 days.

(21) Appl. No.: 17/530,082

(22) Filed: Nov. 18, 2021

(65) Prior Publication Data
US 2022/0078368 A1    Mar. 10, 2022

Related U.S. Application Data

(63) Continuation of application No. PCT/KR2020/006786, filed on May 26, 2020.

(30) Foreign Application Priority Data

May 27, 2019    (KR) .................. 10-2019-0061649

(51) Int. Cl.
*H04N 5/63*    (2006.01)
*H02J 50/00*    (2016.01)
(Continued)

(52) U.S. Cl.
CPC ............. *H04N 5/63* (2013.01); *H02J 50/005* (2020.01); *H02J 50/10* (2016.02); *H02J 50/40* (2016.02);
(Continued)

(58) Field of Classification Search
CPC .......... H02J 50/40; H02J 50/10; H02J 50/005; H02J 1/082; H02J 1/10; H04N 5/63; G06F 3/1446
See application file for complete search history.

(56) References Cited

U.S. PATENT DOCUMENTS 9,477,438 B1 * 10/2016 Hochman ............ H01R 13/665
9,501,159 B2 * 11/2016 Bae ...................... G06F 3/03543
(Continued)

FOREIGN PATENT DOCUMENTS

CN          109066920 A     12/2018
KR    10-2011-0129948 A     12/2011
(Continued)

OTHER PUBLICATIONS

Communication issued May 27, 2022 by the European Patent Office for European Patent Application No. 20812515.3.

*Primary Examiner* — Rockshana D Chowdhury
*Assistant Examiner* — Douglas R Burtner
(74) *Attorney, Agent, or Firm* — Sughrue Mion, PLLC

(57) ABSTRACT

A display apparatus is provided. The display apparatus includes a display including a plurality of display modules, each of which includes a plurality of light emitting devices; a plurality of wireless power transmitters configured to wirelessly transmit power; a plurality of wireless power receivers configured to receive the power from the plurality of wireless power transmitters, each of the plurality of wireless power receivers including output terminals configured to output the power to the plurality of display modules; and a connector configured to connect the output terminals of the plurality of wireless power receivers to each other.

20 Claims, 14 Drawing Sheets

(51) Int. Cl.
*H02J 50/10* (2016.01)
*H02J 50/40* (2016.01)
*H01L 25/16* (2023.01)
*H04N 5/64* (2006.01)

(52) U.S. Cl.
CPC .......... *H01L 25/162* (2013.01); *H01L 25/167* (2013.01); *H04N 5/64* (2013.01)

(56) References Cited

U.S. PATENT DOCUMENTS

| | | | | |
|---|---|---|---|---|
| 9,825,485 | B2* | 11/2017 | Lee | B60L 53/122 |
| 9,852,691 | B2* | 12/2017 | Hyun | G09G 3/2085 |
| 10,491,026 | B2* | 11/2019 | Komulainen | H02J 50/12 |
| 10,790,695 | B2* | 9/2020 | Tong | H02J 50/10 |
| 10,938,242 | B2* | 3/2021 | Choi | H02M 1/083 |
| 11,088,571 | B2* | 8/2021 | Choi | G09G 3/2096 |
| 11,108,272 | B2* | 8/2021 | Kim | H04N 5/63 |
| 11,275,549 | B2* | 3/2022 | Choi | H04B 10/60 |
| 11,381,116 | B2* | 7/2022 | Choi | H02J 50/12 |
| 11,474,571 | B2* | 10/2022 | Jeong | G06F 1/203 |
| 11,500,437 | B2* | 11/2022 | Lee | G06F 3/16 |
| 11,664,685 | B2* | 5/2023 | Kim | H02J 50/005 |
| | | | | 348/730 |
| 2009/0244001 | A1* | 10/2009 | Nakai | G09G 3/2092 |
| | | | | 345/156 |
| 2014/0012641 | A1* | 1/2014 | Birch | G06F 3/14 |
| | | | | 705/14.4 |
| 2015/0381240 | A1* | 12/2015 | Yoshida | H02J 50/12 |
| | | | | 307/31 |
| 2017/0192733 | A1* | 7/2017 | Huang | G06F 3/1446 |
| 2017/0220310 | A1* | 8/2017 | Hochman | H01R 13/6205 |
| 2018/0219428 | A1* | 8/2018 | Bae | H02J 50/60 |
| 2018/0294653 | A1 | 10/2018 | Pagano et al. | |
| 2018/0313970 | A1 | 11/2018 | Widmer et al. | |
| 2018/0323647 | A1* | 11/2018 | Van Wageningen | H02J 50/10 |
| 2018/0331579 | A1 | 11/2018 | Gong et al. | |
| 2018/0337547 | A1 | 11/2018 | Menegoli et al. | |
| 2018/0337548 | A1 | 11/2018 | Beaver et al. | |
| 2018/0342878 | A1 | 11/2018 | Nagaoka | |
| 2019/0196773 | A1* | 6/2019 | Miles | G06F 3/1446 |
| 2019/0296579 | A1* | 9/2019 | Akatsuka | H02J 50/10 |
| 2020/0006984 | A1* | 1/2020 | Kim | B63G 8/001 |
| 2020/0106288 | A1* | 4/2020 | Tong | H02J 50/40 |
| 2020/0387930 | A1* | 12/2020 | Canceri | G06F 1/1607 |
| 2022/0137476 | A1* | 5/2022 | Trikha | E06B 9/24 |
| | | | | 359/265 |
| 2022/0244901 | A1* | 8/2022 | Li | G06F 3/1446 |
| 2022/0342625 | A1* | 10/2022 | Schwarz | G09G 3/32 |
| 2023/0015655 | A1* | 1/2023 | Wang | G09G 3/32 |
| 2023/0296934 | A1* | 9/2023 | Kim | H01F 38/14 |
| | | | | 349/59 |
| 2024/0085754 | A1* | 3/2024 | Martinson | G06F 3/1423 |

FOREIGN PATENT DOCUMENTS

| | | |
|---|---|---|
| KR | 10-2016-0121698 A | 10/2016 |
| KR | 10-2017-0031509 A | 3/2017 |
| KR | 10-2017-0106083 A | 9/2017 |
| WO | 2014/069239 A1 | 5/2014 |
| WO | 2016/109327 A1 | 7/2016 |

* cited by examiner

DISPLAY APPARATUS WHICH MAY BE POWERED BY WIRELESS POWER TRANSFER

CROSS-REFERENCE TO RELATED APPLICATION(S)

This application is a bypass continuation of PCT International Application No. PCT/KR2020/006786, filed on May 26, 2020, which is based on and claims priority to Korean Patent Application No. 10-2019-0061649, filed on May 27, 2019 in the Korean Intellectual Property Office, the disclosures of which are incorporated by reference herein in their entireties.

BACKGROUND

1. Field

The disclosure relates to a display apparatus that can receive power by wireless power transfer.

2. Description of Related Art

A display apparatus displays content received from an external image source or stored therein to a user, and has been used in various locations, including a home, a workplace, etc.

A modular display apparatus refers to a display apparatus in which display modules are tiled to form a screen.

The modular display apparatus has been widely used as a large format display for a theater, a public place or a home because it can be assembled to have a desired screen-size and a desired shape. For example, multiple display modules may be variously combined and provided as a screen for a whole wall, etc., and may be harmoniously installed in any place.

There is increasing demand for the modular display apparatus to be lightweight and convenient to install.

Technical Problem

Provided are a display apparatus which may be powered by a wireless power transfer, and a control method thereof.

In accordance with an aspect of the disclosure, a display apparatus can distribute output loads of a plurality of wireless power receivers in a modular display apparatus based on a wireless power transfer method.

In accordance with an aspect of the disclosure, a display apparatus includes a plurality of transmitters and receivers for wireless power transfer, with a simple coupling structure between the transmitter and the receiver.

Technical Solution

According to embodiments of the disclosure, a display apparatus includes: a display including a plurality of display modules, each of which includes a plurality of light emitting devices; a plurality of wireless power transmitters configured to wirelessly transmit power; a plurality of wireless power receivers configured to receive the power from the plurality of wireless power transmitters, each of the plurality of wireless power receivers including output terminals configured to output the power to the plurality of display modules; and a connector configured to connect the output terminals of the plurality of wireless power receivers to each other.

The connector may be configured to connect the output terminals of two or more wireless power receivers among the plurality of wireless power receivers, and power consumed in two or more display modules may be distributed and shared by two or more power supplies provided in the two or more wireless power receivers of which the output terminals are connected.

The display apparatus may further include a plurality of direct current (DC)/DC controllers connected to each output terminal of the plurality of wireless power receivers and configured to adjust a level of voltage applied to the plurality of display modules, and a load share controller configured to feed a signal back to the plurality of DC/DC controllers based on load states of the two or more display modules.

Each of the plurality of wireless power transmitters may include a transmission coil configured to generate a magnetic field, and each of the plurality of wireless power receivers may include a reception coil disposed to face a corresponding transmission coil and configured to wirelessly receive the power from the corresponding transmission coil.

Each of the plurality of wireless power receivers may further include: a rectifier configured to rectify and convert alternating current (AC) power received through the reception coil into DC power; and a DC/DC converter configured to regulate and supply DC power received from the rectifier to a corresponding display module.

Each of the plurality of wireless power transmitters may further include: an input power interface configured to receive external AC power and covert the external AC power into DC power; and an inverter configured to convert the DC power output from the input power interface into AC power and provide the AC power to the transmission coil.

The display apparatus may further include: a rear cabinet; and a front cabinet. The transmission coil may be provided in the rear cabinet, and the reception coil may be accommodated in the front cabinet. The front cabinet may be configured to couple with the rear cabinet.

The connector may be provided in one of the rear cabinet or the front cabinet.

The display apparatus may further include a coupling interface configured to provide a physical connection and an electrical connection between the front cabinet and the rear cabinet.

The connector may include a cable configured to connect the output terminals of two or more wireless power receivers among the plurality of wireless power receivers.

According to embodiments of the disclosure, a display apparatus includes: a display including a plurality of display modules, each of which includes a plurality of light emitting devices; a first power supply including: a first wireless power transmitter configured to wirelessly transmit power; a first wireless power receiver configured to receive the power from the first wireless power transmitter; and a first output terminal configured to provide the power to at least one display module among the plurality of display modules; and a second power supply including: a second wireless power transmitter configured to wirelessly transmit the power; a second wireless power receiver configured to receive the power from the second wireless power transmitter; and a second output terminal configured to provide the power to at least one display module among the plurality of display modules. The first output terminal is electrically connected to the second output terminal.

The display apparatus may further include: a first DC/DC controller connected to the first output terminal and the second output terminal; a second DC/DC controller connected to the first output terminal and the second output terminal; a first load share controller configured to feed a first signal back to the first DC/DC controller based on load states of all the one or more display modules provided with the power by the first output terminal; and a second load share controller configured to feed a second signal back to the second DC/DC controller based on load states of all the one or more display modules provided with the power by the second output terminal. The first DC/DC controller and the second DC/DC controller may be configured to adjust a level of voltage applied to the corresponding display modules.

Each of the first wireless power transmitter and the second wireless power transmitter may include a transmission coil configured to generate a magnetic field, and each of the first wireless power receiver and the second wireless power receiver may include a reception coil disposed to face a corresponding transmission coil and configured to wirelessly receive the power from the corresponding transmission coil.

The transmission coil of each of the first wireless power transmitter and the second wireless power transmitter may be provided in a rear cabinet of the display apparatus, the reception coil of each of the first wireless power receiver and the second wireless power receiver may be provided in a front cabinet of the display apparatus, and the front cabinet may be configured to couple with the rear cabinet.

One of the rear cabinet or the front cabinet may include a connector configured to connect the first output terminal and the second output terminal.

DESCRIPTION OF DRAWINGS

The above and other aspects, features and advantages of certain embodiments of the disclosure will be more apparent from the following description taken in conjunction with the accompanying drawings in which.

DETAILED DESCRIPTION

Figure 1:
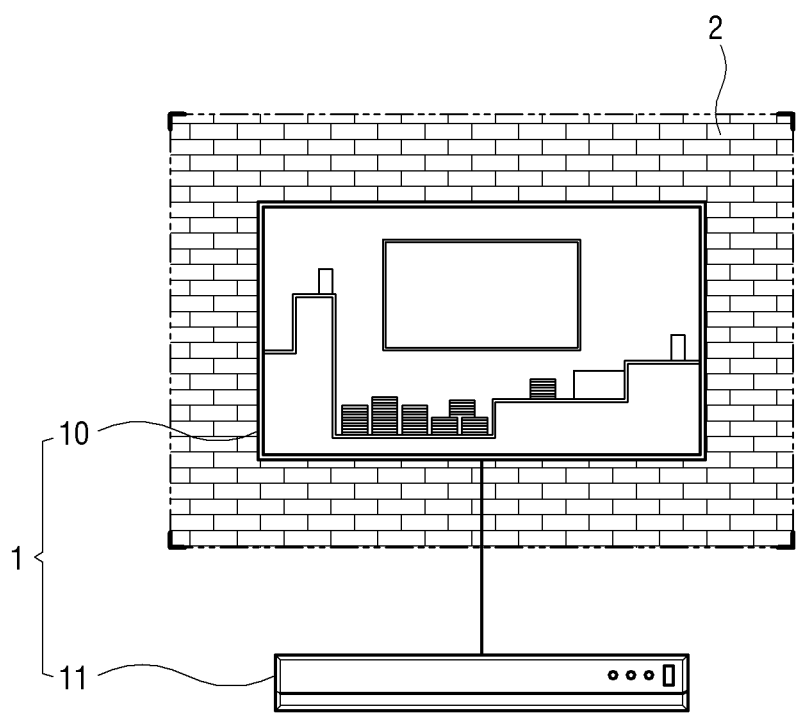
FIG. 1 illustrates a display apparatus according to an embodiment.

Below, embodiments will be described in detail with reference to accompanying drawings. In the drawings, like numerals or symbols refer to like elements having substantially the same function, and the size of each element may be exaggerated for clarity and convenience of description. However, the configurations and functions illustrated in the following embodiments are not construed as limiting the configurations and functions. In the following descriptions, details about publicly known functions or features will be omitted if it is determined that they cloud the gist of embodiments.

As used herein, the terms '1st' or 'first' and '2nd' or 'second' may use corresponding components regardless of importance or order and are used to distinguish a component from another without limiting the components. Further, expressions such as 'at least one of,' when preceding a list of elements, modify the entire list of elements and do not modify the individual elements of the list. For example, the expression, 'at least one of a, b, and c,' should be understood as including only a, only b, only c, both a and b, both a and c, both b and c, or all of a, b, and c. As used herein, the terms 'comprise', 'include', 'have', etc., do not preclude the presence or addition of one or more other features, numbers, steps, operations, elements, components or combination thereof. In addition, a 'module' or a 'portion' may perform at least one function or operation, be achieved by hardware, software or combination of hardware and software, and be integrated into at least one module.

FIG. 1 illustrates a display apparatus according to an embodiment.

As shown in FIG. 1, a display apparatus 1 according to an embodiment may be installed on, for example, a wall 2 or the like, and includes a display 10 that displays an image on the front thereof.

According to an embodiment, the display apparatus 1 may further include a main body 11 connectable to the display 10 by a wire or wirelessly as shown in FIG. 1, and display an image, which is based on an image signal output from the main body 11, on the display 10. The main body 11 may output a signal, which is received from an external image source or provided for displaying an image of content stored therein, to the display apparatus 1.

According to an embodiment, the main body 11 includes a media box that outputs a signal for making the display apparatus 1 display an image of various pieces of content. The display apparatus 1 may for example receive content from a plurality of image source, i.e., signal sources through the main body 11.

According to an alternative embodiment, the display apparatus 1 may receive content from various image sources as the main body 11 and the display 10 are formed in a single body.

According to the disclosure, there are no limits to the kinds of image sources for providing content. For example, a set-top box (STB), a personal computer (PC) such as a desktop or laptop computer, a player for an optical disc such as Blu-ray disc or digital versatile disc (DVD), a mobile device including a smart pad such as a smartphone or a tablet computer, etc. Further, the display apparatus 1 may receive content provided in the form of a real-time streaming file through a wired or wireless network.

According to an embodiment, the display apparatus 1 may be embodied in a television (TV) that displays broadcast content.

When the display apparatus 1 is embodied as the TV, the display apparatus 1 may receive and process broadcast content based on at least one of a broadcast signal, broadcast information or broadcast data from a transmitter of a broadcasting station. The display apparatus 1 may wirelessly receive a radio frequency (RF) signal, i.e., a broadcast signal from the broadcasting station. To this end, the display apparatus 1 may include an antenna configured to receive a broadcast signal, and a tuner configured to be tuned to a channel corresponding to a broadcast signal.

The broadcast signal may be received in the display apparatus 1 through a terrestrial wave, a cable, a satellite, etc., and a signal source is not limited to the broadcasting station. Any apparatus or station may be included in the image source according to the disclosure as long as it can transmit and receive data.

According to an embodiment, the display apparatus 1 may operate as a smart TV or an Internet protocol (IP) TV. The smart TV refers to a TV that can receive and display a broadcast signal in real time, support a web browsing function so that various pieces of content can be searched and consumed through the Internet while a broadcast signal is displayed in real time, and provide a convenient user environment for the web browsing function. Further, the smart TV includes an open software platform to provide an interactive service to a user. Therefore, the smart TV is capable of providing various pieces of content, for example, an application for a predetermined service to a user through the open software platform. Such an application refers to an application program for providing various kinds of services, for example, a social network service (SNS), finance, news, weather, a map, music, a movie, a game, an electronic book, etc.

The standards of the received signal may be varied depending on the types of the display apparatus 1. For example, image content may be received by a wire based on high definition multimedia interface (HDMI), composite video, component video, super video, syndicat des constructeurs des appareils radiorécepteurs et téléviseurs (SCART), universal serial bus (USB), etc.

Further, the display apparatus 1 may receive image content from various external apparatuses including a server through wireless communication. There are no limits to the kinds of wireless communication, and the display apparatus 1 may perform at least one of wireless communication using an access point (AP) or wireless communication directly connected to other apparatuses without the AP. For example, the display apparatus 1 may receive content from an image source through Wi-Fi, Wi-Fi Direct, Bluetooth or the like wireless communication.

According to an embodiment, the configuration of the display apparatus 1 for receiving a signal/content may be provided in the main body 11, but embodiments are not limited thereto. For example, the display apparatus 1 may be embodied without the main body 11.

The main body 11 and the display 10 may be connected to and exchange a signal with each other through a wired or wireless interface.

The wired interface may for example include a cable based on a predetermined standard. The wireless interface may for example include at least one of Wi-Fi, Wi-Fi direct, or Bluetooth. In this disclosure, a connection method between the main body 11 and the display 10 is not limited to the foregoing examples, but may employ wired or wireless interfaces based on various standards.

The display apparatus 1 according to an embodiment may be embodied as a large format display (LFD) installable in a wall of a house.

The display 10 includes a display panel 200 embodied as a screen S on which an image is displayed, and the display apparatus 1 according to an embodiment may for example include the display 10 which forms a large-sized or super-sized screen of 400 inches or more.

Figure 2:
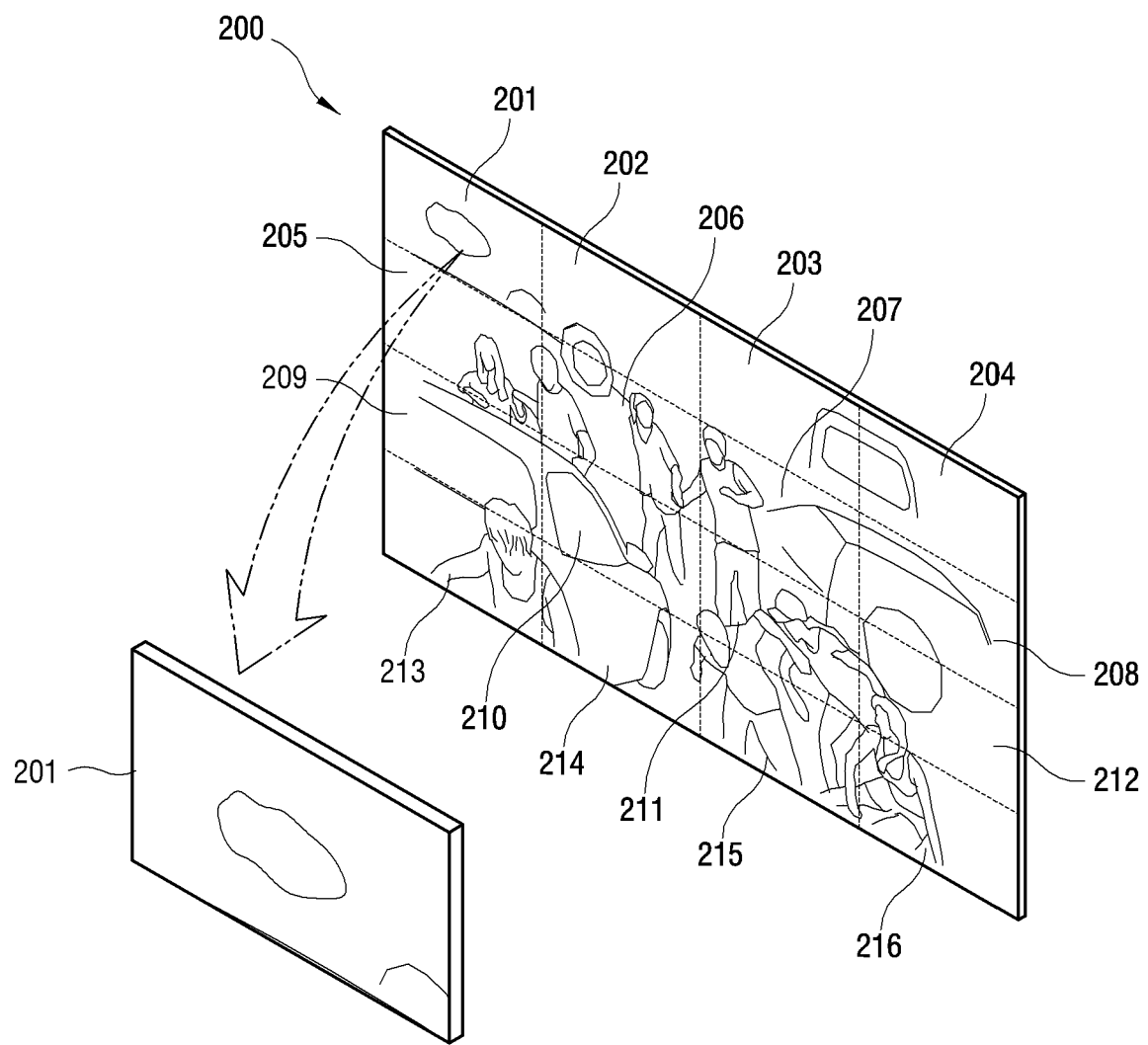
FIG. 2 illustrates a configuration of a display in a display apparatus according to an embodiment.

FIG. 2 illustrates a configuration of a display in a display apparatus according to an embodiment.

In the display apparatus 1 according to an embodiment, the display 10 may, as shown in FIG. 2, include the display panel 200 embodied as a modular type or tiled display in which a plurality of display modules 201~216 (hereinafter, referred to as light source modules, unit modules or modules) mounted with a plurality of light emitting devices and arrayed like tiles.

The display modules 201~216 are, as shown in FIG. 2, arrayed in rows and columns. For example, the plurality of display modules 201~216 may be arrayed in a matrix form, for example, a matrix of 4×4. FIG. 2 shows an example where the plurality of display modules 201~216 are arrayed, and there are no limits to the number and array pattern of the display modules 201~216 according to the disclosure.

The display apparatus 1 according to an embodiment may be embodied by a modular type television, the size of which is varied depending on the number of display modules 201~216.

The plurality of display modules 201~216 arrayed in the matrix form as described above may integrally form the screen S to display an image.

Figure 3:
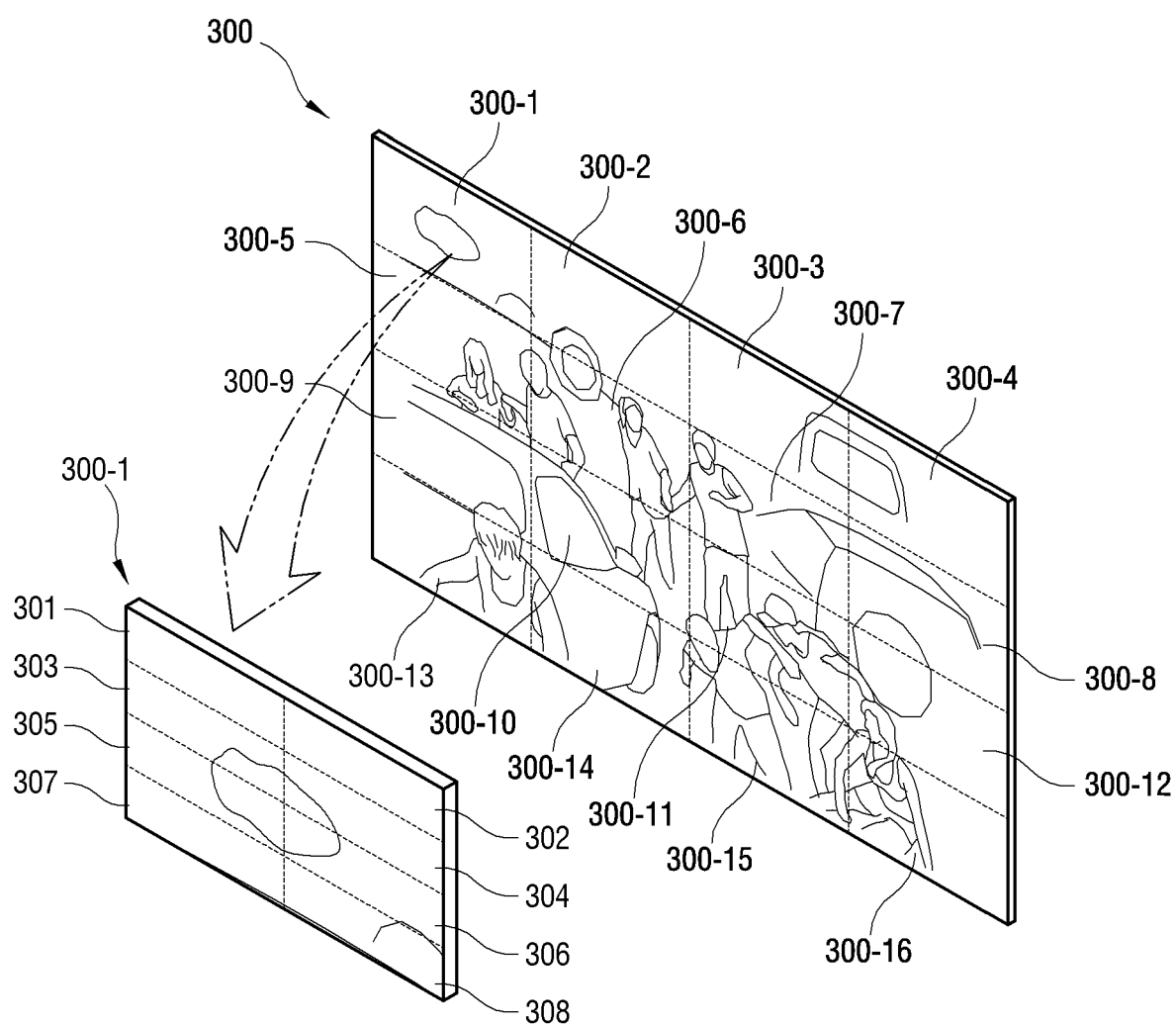
FIG. 3 illustrates a configuration of a display in a display apparatus according to another embodiment.

FIG. 3 illustrates a configuration of a display in a display apparatus according to another embodiment.

The display 10 of the display apparatus 1 according to this embodiment may, as shown in FIG. 3, include a display panel 300 embodied as a modular type or tiled display in which module groups 300-1~300-16 each including two or more display modules 301~308 are formed, and a plurality of module groups 300-1~300-16 are arrayed in the tile form. For example, the display panel 300 according to this embodiment is divided in units of the module groups 300-1~300-16 into which the plurality of display modules 301~308 are grouped.

FIG. 3 shows the display modules 301~308 of one module group 300-1 among the plurality of module groups 300-1~300-16 by way of example, and other module groups 300-2~300-16 may also include a plurality of display modules. Further, there are no limits to the number and array pattern of display modules in each of the module groups 300-1~300-16.

The display apparatus 1 according to this embodiment may be embodied by a modular type display apparatus, the size of which is varied depending on the number of module groups 300-1~300-16 including the display modules 301~308.

Figure 4:
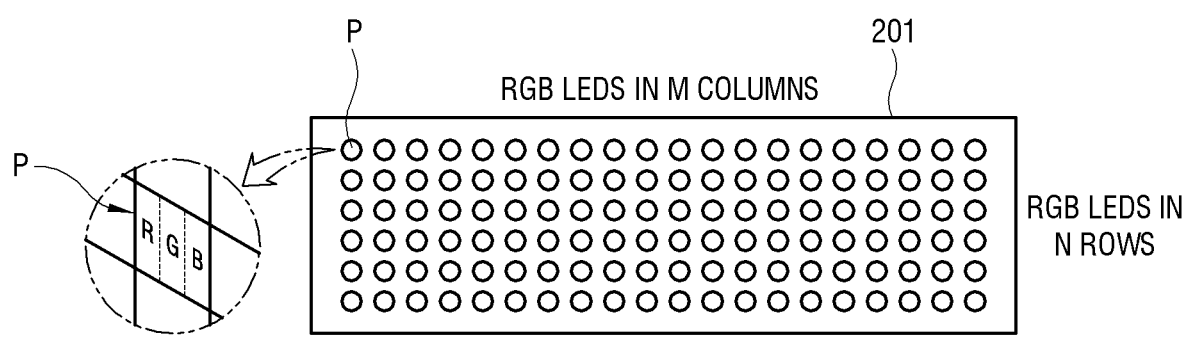
FIG. 4 illustrates an example of a display module of a display in a display apparatus according to an embodiment.

FIG. 4 illustrates an example of a display module of a display in a display apparatus according to an embodiment.

As shown in FIG. 4, each of the display modules 201~216, 301~308, i.e., a tile of the display panel 200 in the display apparatus 1 according to an embodiment includes a plurality of light emitting devices arrayed in the matrix form.

Specifically, each of the display modules 201~216, 301~308 is mounted with a plurality of light emitting devices (hereinafter, referred to as an inorganic light emitting devices) such as light emitting diodes (LED).

The plurality of light emitting devices are, as shown in FIG. 4, mounted in the display modules 201~216 and arrayed in a matrix form of M×N, thereby forming the screen S of the display panel 200.

FIG. 4 shows an example that the plurality of light emitting devices are arrayed in one display module 201 of the display panel 200 according to the embodiment shown in FIG. 2, and the plurality of light emitting devices may also arrayed in the other display modules 202~216 like that shown in FIG. 4. There are no limits to the number and array pattern of light emitting devices mounted to the display modules 201~216.

The display modules 301~308 in the module groups 300-1~300-16 of the display panel 300 according to the embodiment shown in FIG. 3 may also include the plurality of light emitting devices arrayed as shown in FIG. 4. The number and array pattern of light emitting devices mounted to the display modules 301~308 are not limited to those shown in FIG. 4.

The screen S of the display panel 200, 300 is formed with a plurality of pixels P. The plurality of light emitting devices are provided corresponding to the plurality of pixels P.

According to an embodiment, the plurality of pixels P may include at least one light emitting device for red (R), green (G) and blue (B) per pixel P.

According to an alternative embodiment, each pixel P of the plurality of pixels P may include red (R), green (G) and blue (B) light emitting devices.

Each light emitting device is driven to emit light of various brightness levels and various colors based on a control signal. An image displayed on the display panels 200 and 300 may be formed based on combination of light emitted from the plurality of pixels P.

In the display apparatus 1 according to an embodiment, the LED-based display modules 201~216, 301~308 may be manufactured using a very small LED, i.e., a micro-LED in units of micrometers (μm).

According to an embodiment, the display 10 may include a plurality of drivers for driving the plurality of display modules 201~216, 301~308. The plurality of drivers may drive one or more light sources.

For example, sixteen drivers (see 401~416 in FIG. 6 to be described later) may be provided to respectively drive the plurality of display modules 201~216 according to the embodiment shown in FIG. 2. Alternatively, eight drivers may be provided to drive a predetermined number of display modules, for example, to perform driving in units of two display modules such as the display modules 201 and 205 and the display modules 202 and 206 with regard to the plurality of display modules 201~216.

Alternatively, sixteen drivers may be provided to perform driving in units of the module groups 300-1~300-16 according to the embodiment shown in FIG. 3.

The display panel 200, 300 forming the screen S with the plurality of display modules 201~216, 301~308 may be driven to display an image of predetermined content on a partial area or the whole area of the screen. Therefore, the area of the screen on which an image is displayed may include at least one display module.

At least one display module forming the area on which an image is displayed according to an embodiment may be independently driven by its own driver. When an image is displayed on a partial area of the screen, not all the display modules of the display 10 but only some display modules corresponding to the area on which the image is displayed may be selectively driven among the plurality of display modules.

Below, the display apparatus 1 will be described focusing on that the display 10 includes the plurality of display modules 201~216 as shown in FIG. 2. However, there are no limits to the display 10, and therefore the disclosure includes a case that the display 10 is formed in units of module groups 300-1~300-16 including the plurality of display modules 301~308 as shown in FIG. 3.

Below, detailed structure and operations of a wireless power transmitter and a wireless power receiver will be described with reference to the accompanying drawings.

The display apparatus 1 according to an embodiment includes a power supply for supplying driving power to the plurality of display modules 201~216 forming the display 10.

Figure 5:
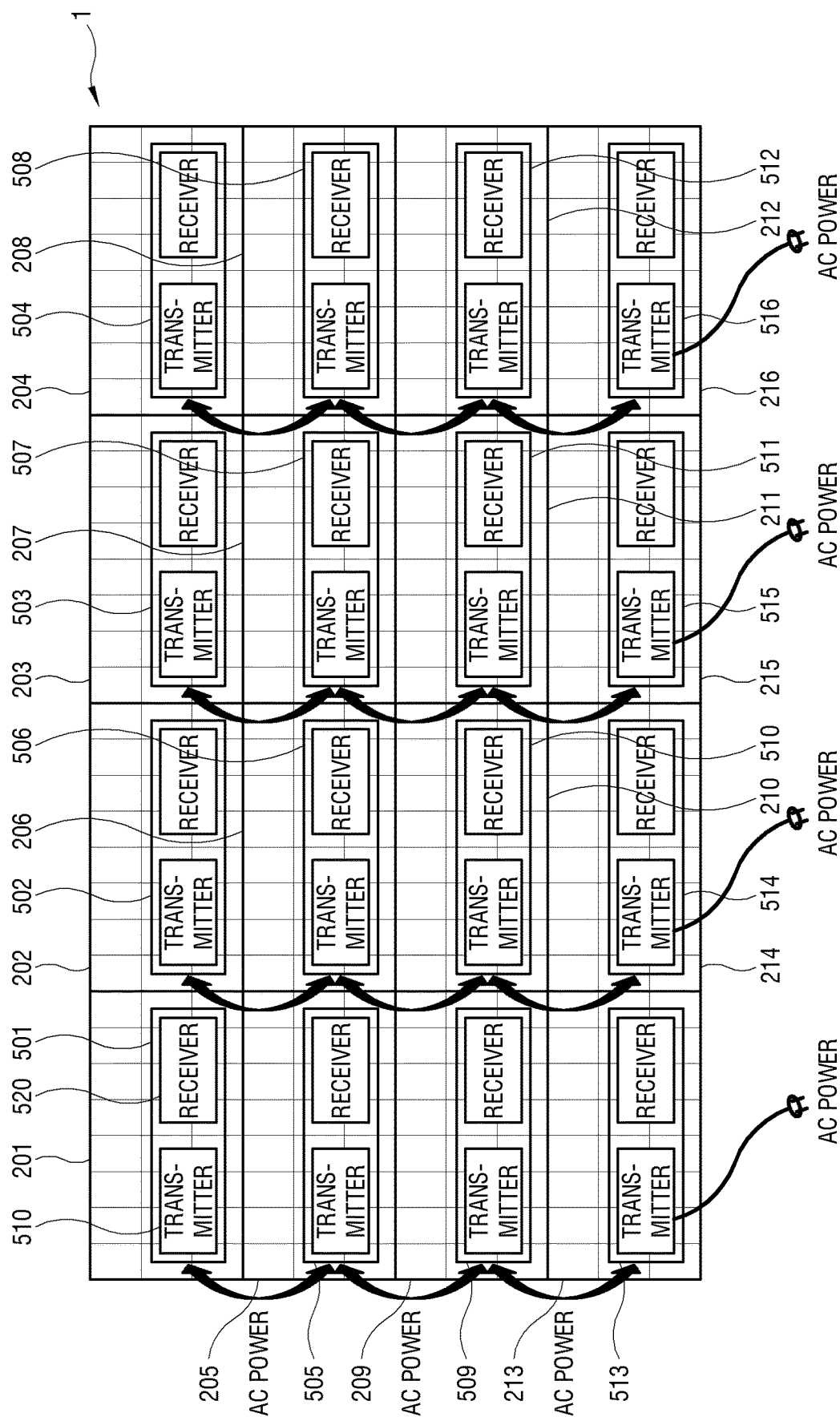
FIGS. 5 and 6 illustrate a configuration where a plurality of power supplies are provided in a display apparatus according to an embodiment.
Figure 6:
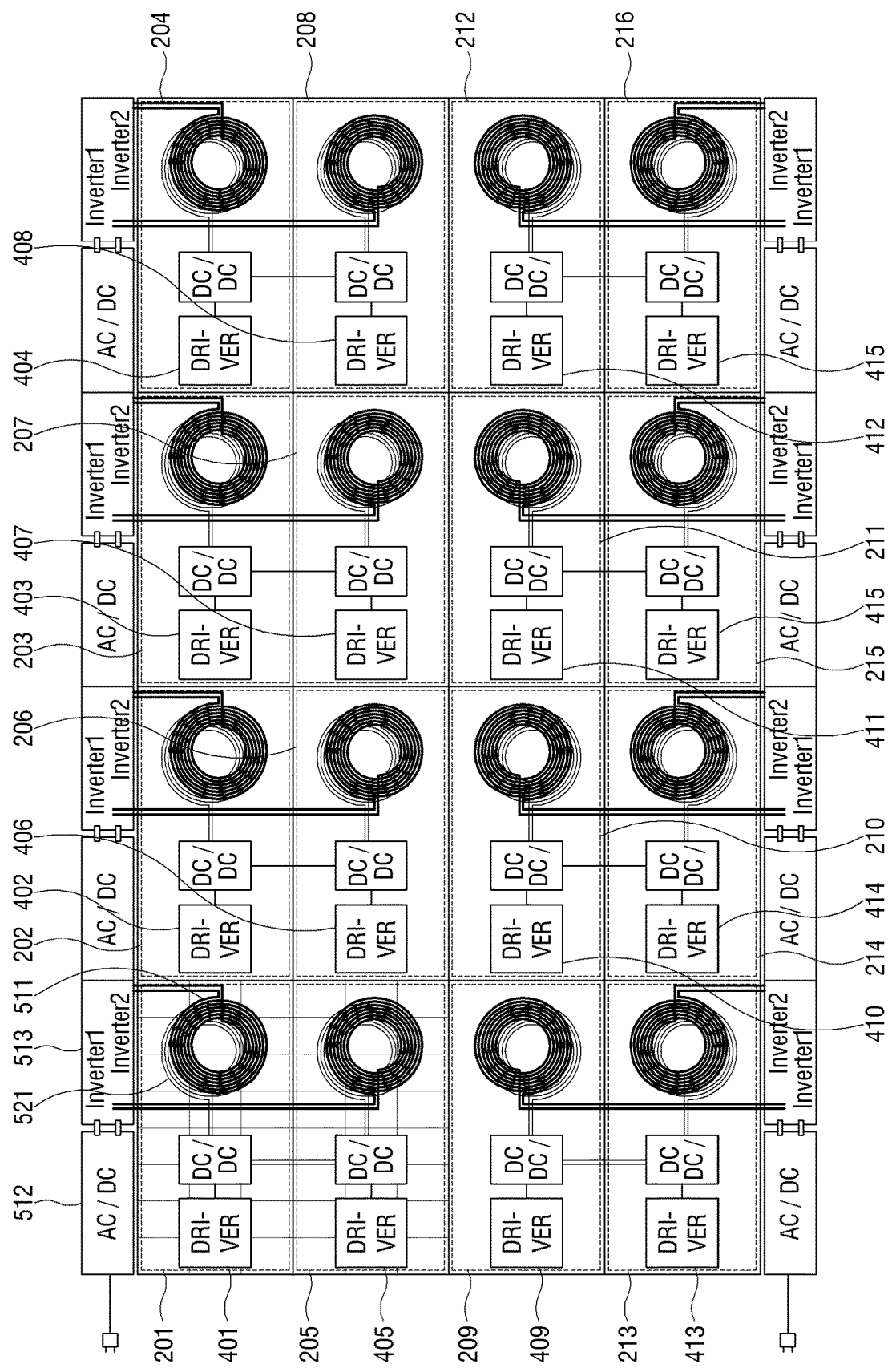

FIGS. 5 and 6 illustrate a configuration where a plurality of power supplies are provided in a display apparatus according to an embodiment.

According to an embodiment, the display apparatus 1 may include a plurality of power supplies 501~516 for supplying power to the display 10 including the plurality of display modules 201~216 as shown in FIGS. 5 and 6. Here, the plurality of power supplies 501~516 may operate as independent power supplies, respectively.

FIG. 5 shows an example that the power supplies 501~516 are provided respectively corresponding to the plurality of display modules 201~216. However, there are no limits to the number and array pattern of the power supplies 501~516. For example, two or more display modules may be configured to receive power from one power supply, or the power supplies may be provided respectively corresponding to the module groups 300-1~300-16 described in FIG. 3. Further, the power supplies 501~516 may supply power even to the drivers 401~406 corresponding to one or more display modules to which the power supplies 501~516 also supply the power.

Each of the power supplies 501~516 may be embodied by a switching mode power supply (SMPS), and receive alternating current (AC) power from the wall of a house, a work place, etc.

According to an embodiment, the plurality of power supplies 501~516 may for example be at least partially connected by a daisy chain method, and receive the AC power from the outside in sequence. Here, the plurality of power supplies 501~516 may be all connected to receive power from a single AC power source, or some power supplies (for example, 501, 505, 509 and 513) among the plurality of power supplies 501~516 may be connected to receive power from the plurality of AC power sources as shown in FIG. 5.

According to an embodiment, the power supplies 501~516 of the display apparatus 1 have a structure capable of wirelessly transmitting and receiving power.

Referring to FIG. 5, each of the power supplies 501~516 may include a wireless power transmitter (hereinafter, also referred to as a transmitter or a power transmitter) 510 for transmitting power wirelessly, and a wireless power receiver (hereinafter, also referred to as a receiver or a power receiver) 520 for receiving power from the corresponding wireless power transmitter.

The display apparatus 1 according to an embodiment may include a plurality of wireless power transmitters 510 receiving input power and wirelessly transmitting the power, and a plurality of wireless power receivers 520 receiving the power from the plurality of wireless power transmitters 510 and including an output terminal to provide power to the plurality of display modules 200-1~200-8 forming the display 10.

The display apparatus 1 according to an embodiment may carry out the wireless power transfer based on a magnetic induction method or a magnetic resonance method by which a magnetic field, which oscillates at a predetermined frequency, is generated in the transmitter 510 so that energy (power) can be transferred to the receiver 520.

Specifically, as shown in FIG. 6, the wireless power transmitter 510 includes a transmission coil (TX Coil) 511 (hereinafter, also referred to as a primary coil or a primary resonator) for generating a magnetic field, and the wireless power receiver 520 includes a reception coil (RX Coil) 521 (hereinafter, also referred to as a secondary coil or a secondary resonator) for receiving power. The transmission coil 511 and the reception coil 521 may constitute a transformer that transfers power from the transmission side (the primary side) to the reception side (the secondary side).

Therefore, according to the disclosure, the modular type display apparatus 1 includes a plurality of transmission coils 511/reception coils 521 for the wireless power transfer, and thus the power sources are distributed to the modules, thereby making it possible to control power independently. Further, a configuration for variable load sharing among the plurality of power supplies 501~516 each including the transmission coil 511/the reception coil 521 may be designed by feedback on load states thereof.

In the display apparatus 1 according to an embodiment, various elements of the power supplies 501~516 may be accommodated in a cabinet forming an outer appearance (i.e., frame).

According to an embodiment, each cabinet includes a front cabinet and a rear cabinet, which have a structure for coupling with each other. For example, the wireless power transmitter 510 may be installed in the rear cabinet, and the wireless power receiver 520 may be installed in the front cabinet.

Therefore, while the display apparatus 1 is installed at a house or the like, the display apparatus 1 including the plurality of power supplies 501~516 may be easily installed by fastening, i.e., coupling the corresponding front cabinet to the rear cabinet previously installed on the wall 2. Such a coupling structure of the cabinet will be described in detail with reference to FIGS. 10 and 11.

Figure 7:
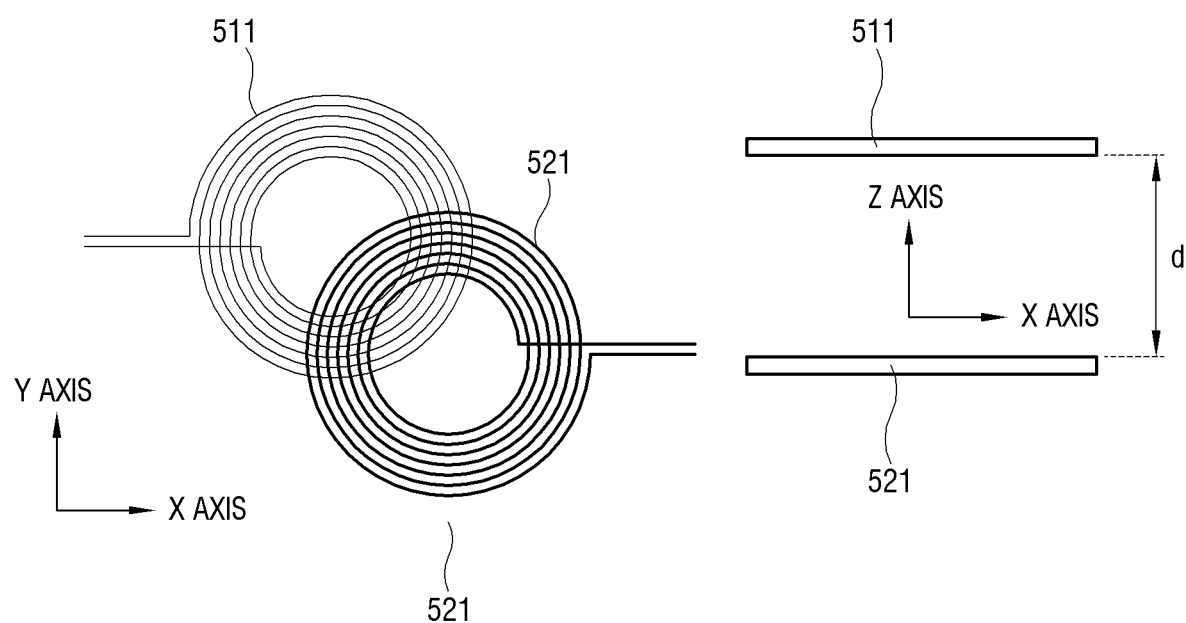
FIG. 7 illustrates a configuration of a wireless power transmitter and a wireless power receiver in a display apparatus according to an embodiment.

FIG. 7 illustrates a configuration of a wireless power transmitter and a wireless power receiver in a display apparatus according to an embodiment.

According to an embodiment, as shown in FIG. 7, the wireless power transmitter 510 and the wireless power receiver 520 may respectively include the transmission coil 511 and the reception coil 521 as windings wound around cores. There are no limits to the material and shape of coils. For example, the coils 511 and 521 may be shaped as conducting wires of copper are wound. FIG. 7 shows that the transmission coil 511 and the reception coil 521 have the same shape and the same size, but the transmission coil 511 and the reception coil 521 do not necessarily have the same shape and the same size.

According to an embodiment, the transmission coil 511 and the reception coil 521 are arranged to be spaced apart at a predetermined distance d from each other and face each other with respect to the Z-axial direction as shown in FIG. 7. Here, the transmission coil 511 and the reception coil 521 are positioned to face each other, and naturally spaced apart from each other by the cabinets, i.e., the rear cabinet and the front cabinet in which the transmission coil 511 and the reception coil 521 are respectively accommodated. Therefore, the distance d is kept between the transmission coil 511 and the reception coil 521 in each of the plurality of power supplies 501~516, thereby stably carrying out the wireless power transfer.

Figure 8:
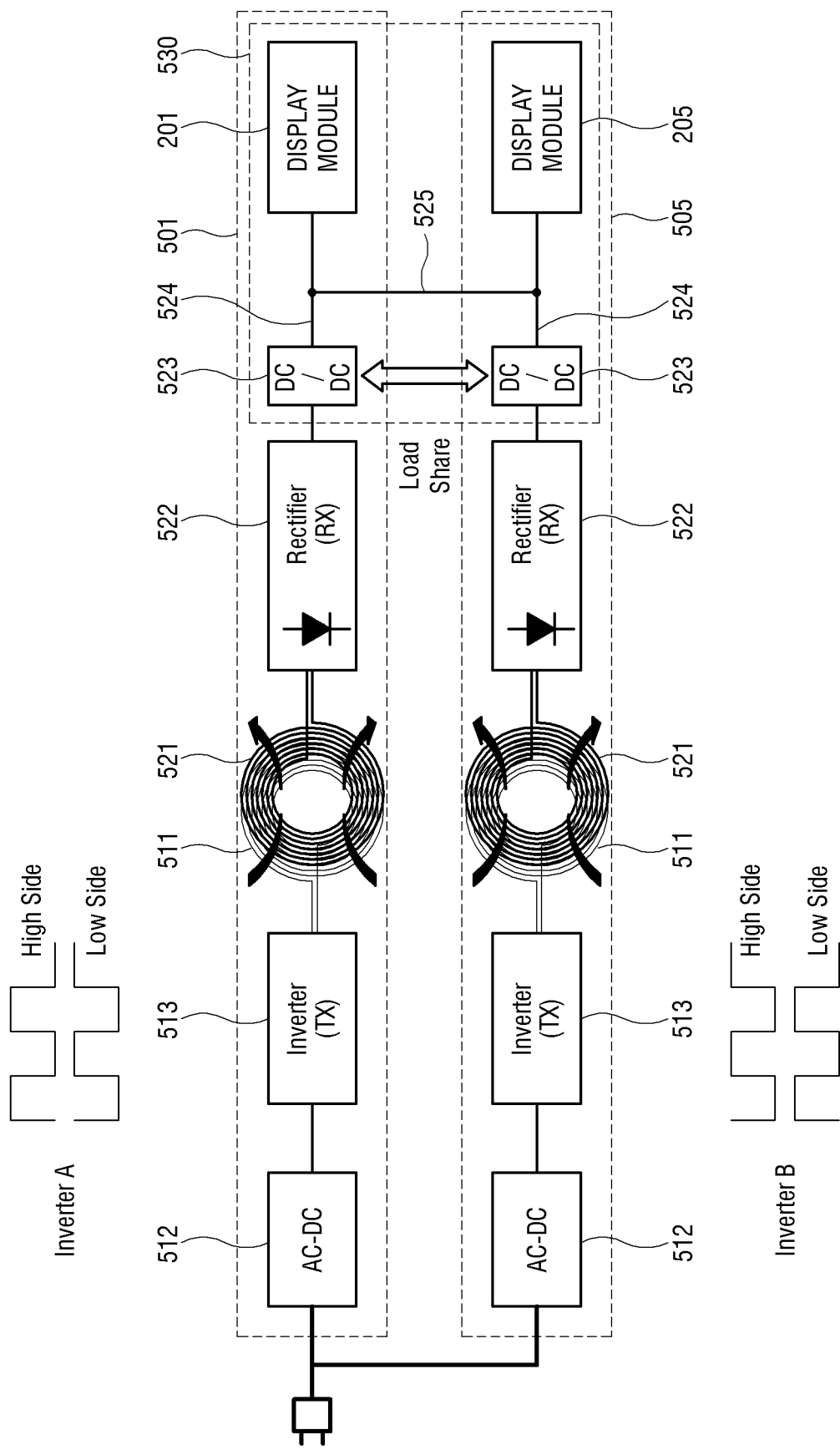
FIG. 8 illustrates a configuration of a power supply for wireless power transfer in a display apparatus according to an embodiment.

FIG. 8 illustrates a configuration of a power supply for wireless power transfer in a display apparatus according to an embodiment.

FIG. 8 shows two power supplies 501 and 505 by way of example among the plurality of power supplies 501~516 provided in the display apparatus 1 according to an embodiment, and the same configurations may be applied to the other power supplies 502~504, 506~516.

As shown in FIG. 8, each of the power supplies 501~516 includes the transmission coil 511, an input power interface (AC/DC) 512, and an inverter 513 as the elements of the wireless power transmitter (TX) 510; and the reception coil 521, a rectifier 522, and a DC/DC converter 523 as the elements of the wireless power receiver (RX) 520.

The input power interface 512 receives commercial power, i.e., AC power and converts the AC power into direct current (DC) power.

According to an embodiment, the input power interface 512 may include a power factor corrector (PFC) to control the power factor of the input AC power and convert the AC power into the DC power, and a capacitor to store power output from the PFC. Further, the input power interface 512 may further include a noise filter to filter out noise of the input AC power.

The inverter 513 converts the DC power output from the input power interface 512 into the AC power and supplies the converted AC power to the transmission coil 511. Here, the inverter 513 is capable of converting the input power into a power signal having a high frequency for the wireless power transfer.

According to an embodiment, the inverter 513 may be embodied by an inverter circuit including a plurality of switching devices, and the AC power may be supplied to the transmission coil 511 in response to switching operations of the switching devices. The inverter 513 may, for example, be embodied by a half-bridge type inverter circuit using two switching devices. However, there are no limits to the embodiment of the inverter 513, and the inverter 513 may, for example, be embodied by a full-bridge type inverter circuit using four or more switching devices.

In the display apparatus 1 according to an embodiment, the transmission coil 511 and the reception coil 521 may be configured to perform the wireless power transfer based on resonance. Here, the inverter 513 makes the transmission coil 511 and the reception coil 512 operate based on a preset frequency (i.e., an operation frequency) and resonate with each other, thereby transferring power from the transmission coil 511 to the reception coil 512.

The preset frequency may, for example, be identified corresponding to a resonance frequency of an LLC resonance converter, or may be identified as a frequency of a preset range or a frequency of a fixed value.

A resonator including the transmission coil 511 and the reception coil 521 may for example employ the LLC resonance converter. However, the resonator usable for the display apparatus 1 is not limited to the LLC resonance converter, but may employ one among various converters derived from the LLC resonance converter, for example, a flyback converter, a forward converter, etc.

The reception coil 521 resonates with the transmission coil 511 based on switching operations of the inverter 513, thereby receiving the AC power from the transmission coil 511.

The rectifier 522 converts the AC power received through the reception coil 521 into the DC power by rectifying the AC power.

According to an embodiment, the rectifier 522 may include a rectification diode for rectifying an electric current of the reception coil 521, and a capacitor for smoothing the voltage passed through the rectification diode.

The DC/DC converter 523 regulates the DC power received from the rectifier 522 to match operation voltages of loads, i.e., one or more corresponding display modules.

The DC power regulated in the DC/DC converter 523 is transferred to an output terminal 524, and then supplied to a target for power supply, i.e., the display modules 201 and 205 through the output terminal 524. The DC power transferred to the output terminal 524 may be supplied to other elements of the display apparatus 1 as well as the display module, for example, the drivers 410 and 405, etc., corresponding to the display modules 201 and 205 targeted for the power supply.

The display apparatus 1 according to an embodiment may include a load sharer 530 for sharing, i.e., distributing loads by connecting the output terminals 524 of two or more wireless power receivers 520 through a connector 525 as shown in FIG. 8. By the load sharer 530, two or more power supplies 501 and 505 may be connected in parallel.

Figure 9:
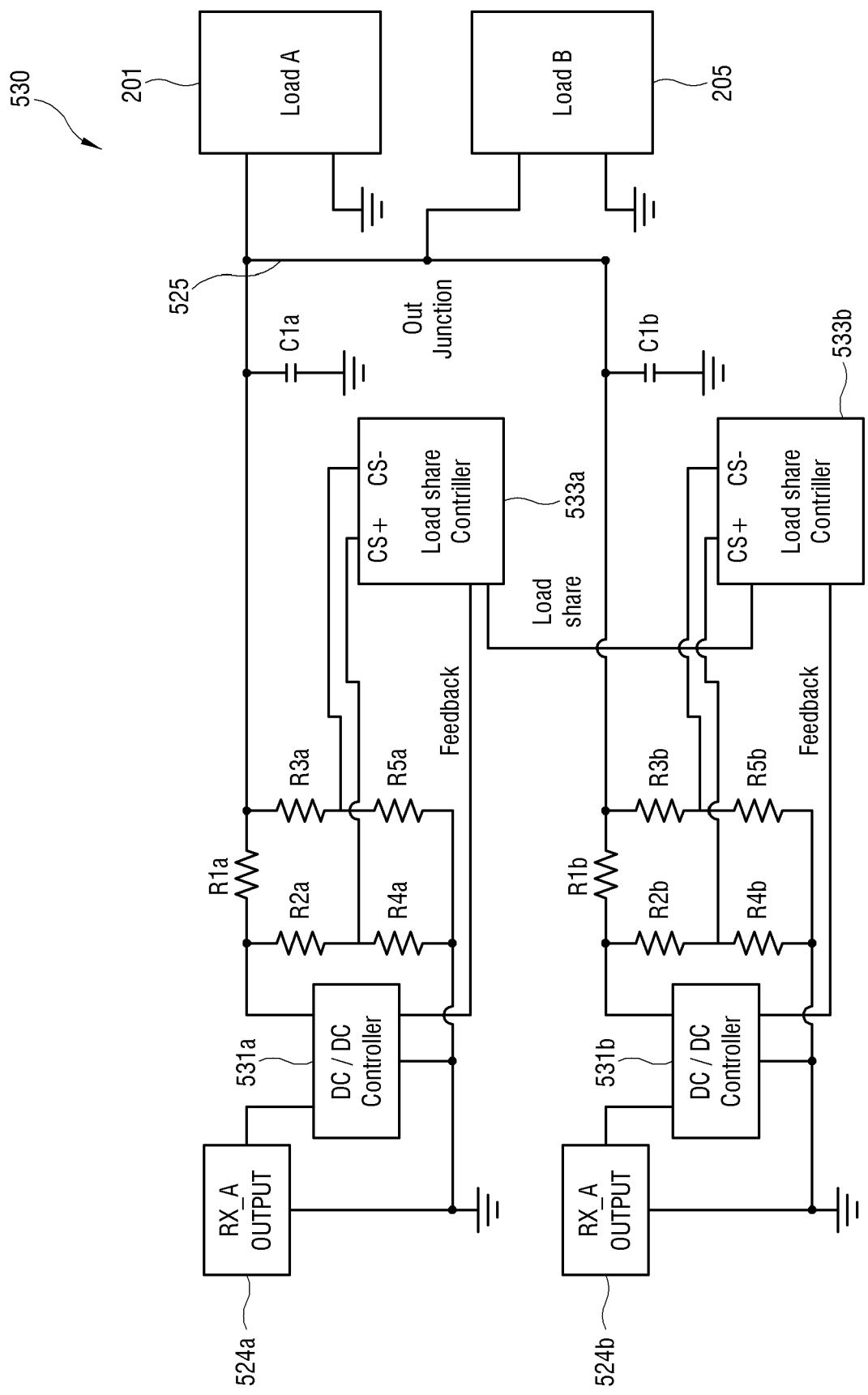
FIG. 9 is a circuit diagram of a load sharer provided in a display apparatus according to an embodiment.

FIG. 9 is a circuit diagram of a load sharer provided in a display apparatus according to an embodiment.

According to an embodiment, the load sharer 530 may, as shown in FIG. 9, be connected to the output terminals 524a and 524b of the wireless power receivers 520 of two or more power supplies 501 and 505, so that the power supplies 501 and 505 can share power to be supplied to two loads Load A and Load B, i.e., the display modules 201 and 205.

The load sharer 530 shown in FIG. 9 is for example provided to share the loads, i.e., distribute the power in the output terminals 524a and 524b at the reception sides of the power supplies 501 and 505 provided to supply the power to the loads, i.e., the display modules 201 and 205. However, the load sharing structure according to the disclosure is not limited to the connection of two loads (i.e., display modules), but may be embodied for three or more display modules in such a manner that the load sharer is configured by connecting the output terminals of the three or more display modules.

As shown in FIG. 9, the load sharer 530 includes DC/DC controllers 531a and 531b respectively connected to the output terminals 524a and 524b of two or more wireless power receivers, and load share controllers 533a and 533b to output signals to the corresponding DC/DC controllers 531a and 531b.

According to an embodiment, the load sharer 530 may, as shown in FIG. 9, be provided so that a power supply 501 and a power supply 505 can share supplying of power to all the loads (i.e., display modules) 201 and 205 targeted for the power sharing as the output sides to the loads Load A and Load B, i.e., the display modules 201 and 205 are connected/joined (i.e., out junction) by the connector 525.

The load sharing is possible based on connection between the load share controllers 533a and 533b, and a signal may be fed back (feedback) to the DC/DC controllers 531a and 531b so that the power supplies 501 and 505 can share the power corresponding to all the loads 201 and 205. The load share controllers 533a and 533b may be embodied by a load sharing IC.

The DC/DC controllers 531a and 531b may control the corresponding DC/DC converter (see '523' in FIG. 8) so that the levels of voltage applied from the power supplies 501 and 505 to the corresponding loads Load A and Load B, i.e., the display modules 201 and 205 can be adjusted based on the signals received from the corresponding load share controllers 533a and 533b.

In the foregoing display apparatus 1 according to an embodiment, the load sharer 530 may be configured to connect the output terminals 524a and 524b (see '524' in FIG. 8) of the plurality of power supplies 501 and 505. Here, when the load share controllers 533a and 533b share the states of both loads 201 and 205 and give feedbacks, the levels of the voltages output through the DC/DC converter 523 are adjusted under control of the DC/DC controllers 531a and 531b, so that both the power supplies 501 and 505 can share the loads 201 and 205.

Accordingly, variable loads are shared among and properly handled by the power supplies connected in parallel based on the sharing structure, without increasing the capacities of the transmission coil 511/the reception coil 521 or the DC/DC converter 523 to cope with the peak power at a specific load.

For example, when the display apparatus 1 displays an image on a screen area corresponding to the display module 201 but does not display an image on an area corresponding to the display module 205, power consumption may increase at the specific display module 201. The display module 201 may have the maximum load Max Load, but the display module 205 may have the minimum load Min Load.

The load share controllers 533a and 533b share the states of the two loads 201 and 205, and output signals to the DC/DC controllers 531a and 531b so that the power to be supplied to all the loads 201 and 205, i.e., the display module 201 of displaying the image can be shared between the power supplies 501 and 505.

In this regard, the level of the power output through the DC/DC converter 523 is adjusted, so that the power supply 501 and the power supply 505 can share the power to be supplied to the loads. This may, as shown in FIG. 8, be understood based on the same coupling magnetic flux between the transmission coil 511 and the reception coil 521.

Therefore, when the power consumption increases at the specific module, i.e., at the display module 201, it is possible to prevent malfunctions due to magnetic flux increase in the coil or minimize a frequency or electromagnetic interference (EMI) harmful to a human body by decreasing effects of magnetic flux interlinkage between the coils 511 and 521.

In the display apparatus 1 according to an embodiment, it is possible to decrease the effect of the magnetic field and improve the reduction of the EMI by increasing the number of power supplies connected in parallel for power sharing, i.e., load sharing, and it is therefore possible to use a variable load sharing structure for connecting a suitable number of power supplies based on a coupling structure between the cabinets to be described later.

Figure 10:
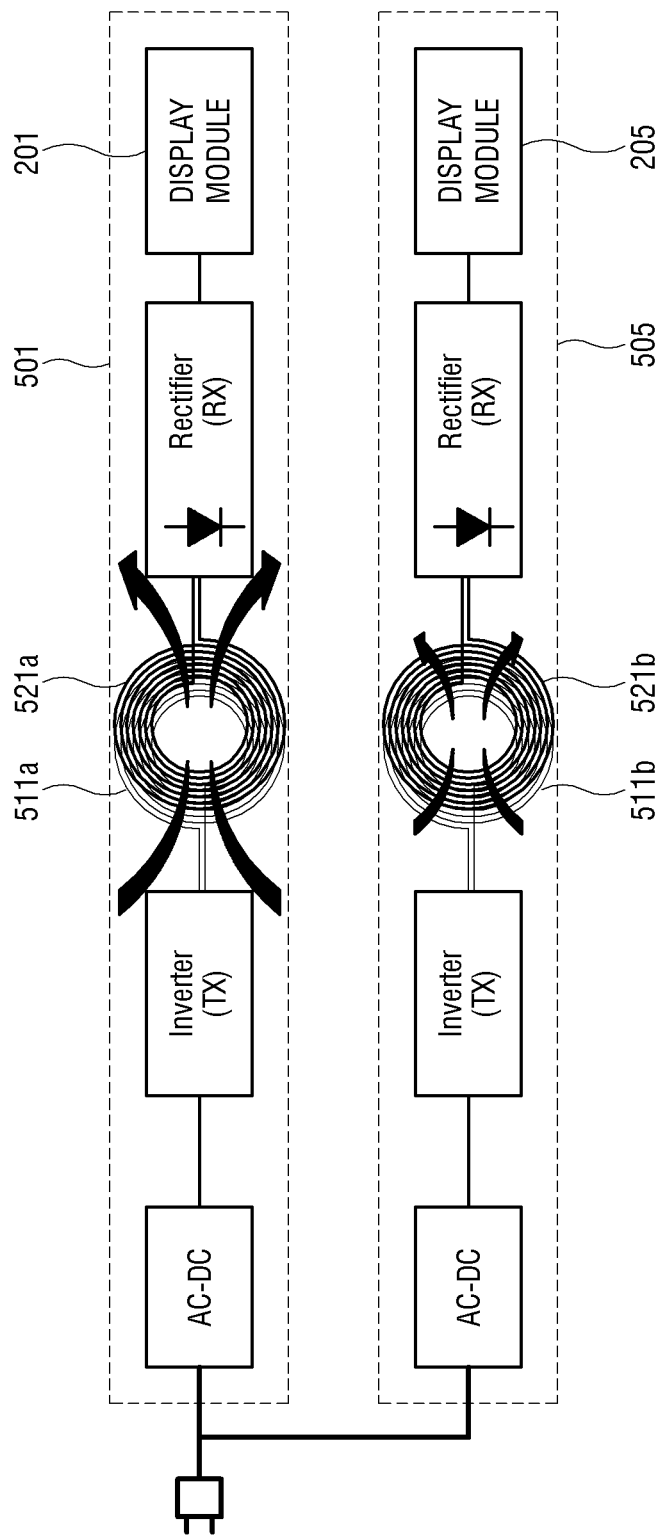
FIG. 10 illustrates a structure of a plurality of power supplies in another display apparatus.

FIG. 10 illustrates a structure of a plurality of power supplies in another display apparatus.

As shown in FIG. 10, in a comparative example, the structures of the power supplies are independent of one another without load sharing.

Thus, when the display apparatus displays an image on the screen area corresponding to the display module 201 but does not display an image on the area corresponding to the display module 205, for example, when the display module 201 has the maximum load Max Load but the display module 205 has the minimum load Min Load, the power supplies 501 and 505 are configured to supply the power to only their matching loads 201 and 205. This may, as shown in FIG. 10, be understood based on that coupling magnetic flux between a transmission coil 511a and a reception coil 521b at the side of the maximum load 201 is stronger than the coupling magnetic flux between a transmission coil 511b and a reception coil 521b at the side of the minimum load 205.

With the foregoing load sharing structure, the display apparatus 1 according to an embodiment can normally supply power to the plurality of loads, i.e., the display modules 201~216 even though at least one among the plurality of power supplies 501~516 does not normally operate.

When the display apparatus displays an image on the screen areas corresponding the display module 201 and the display module 205, the power supply 501 and the power supply 505 may be operated to supply the power to the corresponding loads 201 and 205.

On the other hand, for example, when the power supply 505 does not normally operated, it is possible to supply power from the power supply 501 to the display module 201 and the display module 202 because of the load sharing structure where the output terminals 524 of the power supplies 501 and 505 are connected to each other by the connector 525. Here, the DC/DC controller 531a may control the voltage level of the corresponding DC/DC converter 523 of the power supply 501 based on a feedback signal from the load share controllers 533a and 533b.

Below, the coupling structure between the wireless power transmitter and the wireless power receiver will be described with reference to the accompanying drawings.

Figure 11:
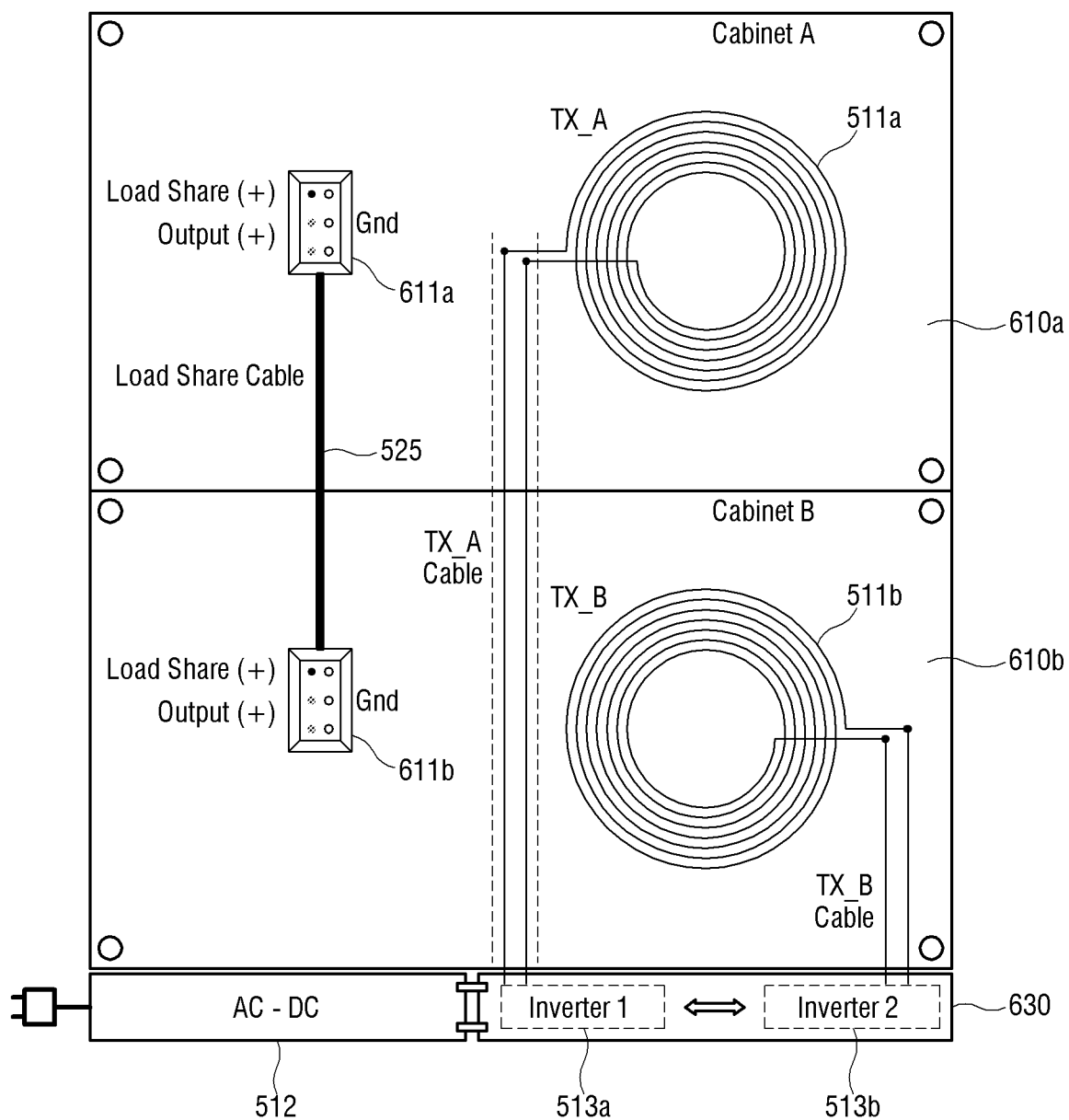
FIGS. 11 and 12 illustrate coupling structures between a wireless power transmitter and a wireless power receiver in a display apparatus according to an embodiment.
Figure 12:
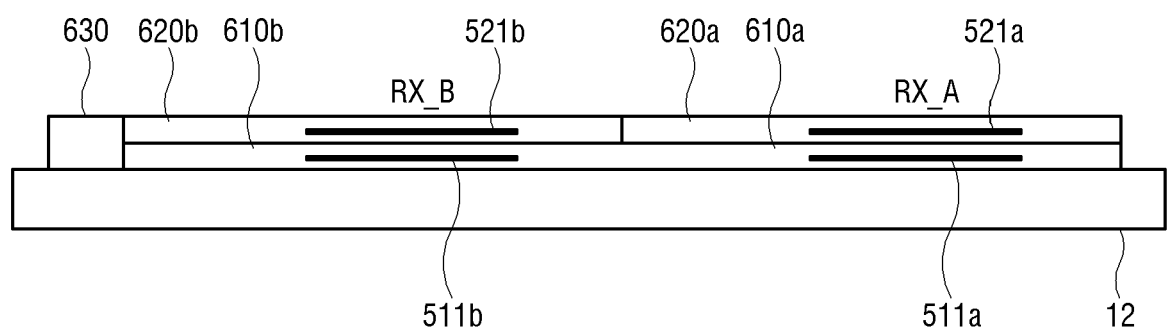

FIGS. 11 and 12 illustrate coupling structures between a wireless power transmitter and a wireless power receiver in a display apparatus according to an embodiment.

In the display apparatus 1 according to an embodiment, the plurality of power supplies 501~516 are accommodated in between the front cabinets and the rear cabinets having a fastening structure to couple with each other. For example, the wireless power transmitter 510 may be installed in the rear cabinet, and the wireless power receiver 520 may be installed in the front cabinet.

FIGS. 11 and 12 illustrate the power supplies 501 and 505, which are provided to supply power to the display modules 201 and 205 and have a structure for sharing load with each other, by way of example, and the same structure may be applied to other power supplies. Further, even when three or more power supplies have a load sharing structure, the load sharing structure may be embodied by connecting the output terminals of the wireless power receivers 520 of the power supplies through the connector 525.

FIG. 11 is a front view illustrating that rear cabinets 610a and 610b are installed on a wall 12 before front cabinets 620a and 620b are coupled to the rear cabinets 610a and 610b, and FIG. 12 is a lateral view illustrating that the front cabinets 620a and 620b are respectively coupled to the rear cabinets 610a and 610b.

In a process of installing the display apparatus 1 according to an embodiment at home or the like, as shown in FIGS. 11 and 12, the rear cabinets (Cabinet A and Cabinet B) 610a and 610b with the built-in transmission coils 511a and 511b, i.e., with the elements of the wireless power transmitter 510 of the power supplies 501 and 505 may for example be previously laid out on the wall 12.

Here, the front cabinets 620a and 620b and the rear cabinets 610a and 610b may be provided with fastening couplers 611a and 611b at positions corresponding to the cabinets 620a, 620b, 610a and 610b. FIG. 11 illustrates the fastening couplers 611a and 611b provided in the rear cabinets 610a and 610b by way of example. Likewise, corresponding connectors, which is positioned corresponding to and can be coupled to the fastening couplers 611a and 611b, may also be provided in the front cabinets 620a and 620b.

When the front cabinets 620a and 620b and the rear cabinets 610a and 610b are coupled to each other, not only physical coupling but also electric connection is achieved by coupling between the fastening couplers 611a and 611b.

According to the disclosure, a coupling method between the front cabinets 620a and 620b and the rear cabinets 610a and 610b is not limited to use of the fastening couplers 611a and 611b, and thus not the fastening coupler but other connecting methods may be employed.

Specifically, as shown in FIG. 12, the front cabinets 620a and 620b with the built-in reception coils 521a and 521b, i.e., the elements of the wireless power receiver 520 of the power supplies 501 and 505 are respectively fastened to the previously installed rear cabinets 610a and 610b, from front to back. In this way, the front cabinets 620a and 620b are fastened to the rear cabinets 610a and 610b, thereby having a structure for coupling and sharing the output terminals 524a and 524b.

In the power supplies 501 and 505 according to an embodiment, the output terminals 524a and 524b of their wireless power receivers 520 are connected to each other by the connector 525. Here, as shown in FIG. 11, the load sharing structure is achieved by a simple method of adding a load share cable as a connector 252 to the rear cabinets 610a and 610b. Further, the cabinets coupled to each other cause even a relatively thin shielding sheet to have a high shielding effect, thereby having advantages of being relatively strong in even a problem of heat generation.

FIG. 11 shows an example that the connector 525 is positioned in the rear cabinets 610a and 610b, but there are no limits to the position of the connector 525 according the disclosure. For example, the connector 525 may be positioned in the front cabinets 620a and 620b or other places.

According to an embodiment, an accommodating portion 630, in which the input power interface 512 and the inverters 513a and 513b are accommodated as the elements of the wireless power transmitter 520, may be separately provided beneath the cabinet. The inverters 513a and 513b are configured to transfer the AC power to the corresponding transmission coils 511a and 511b. The installation positions for the input power interface 512 and the inverters 513a and 513b are not limited to those shown in the accompanying drawings. When the load sharing structure is given for three or more power supplies, the transmission coils may be taken into account to set the installation positions.

Below, detailed configurations of the display apparatus according to an embodiment will be described with reference to the accompanying drawings.

Figure 13:
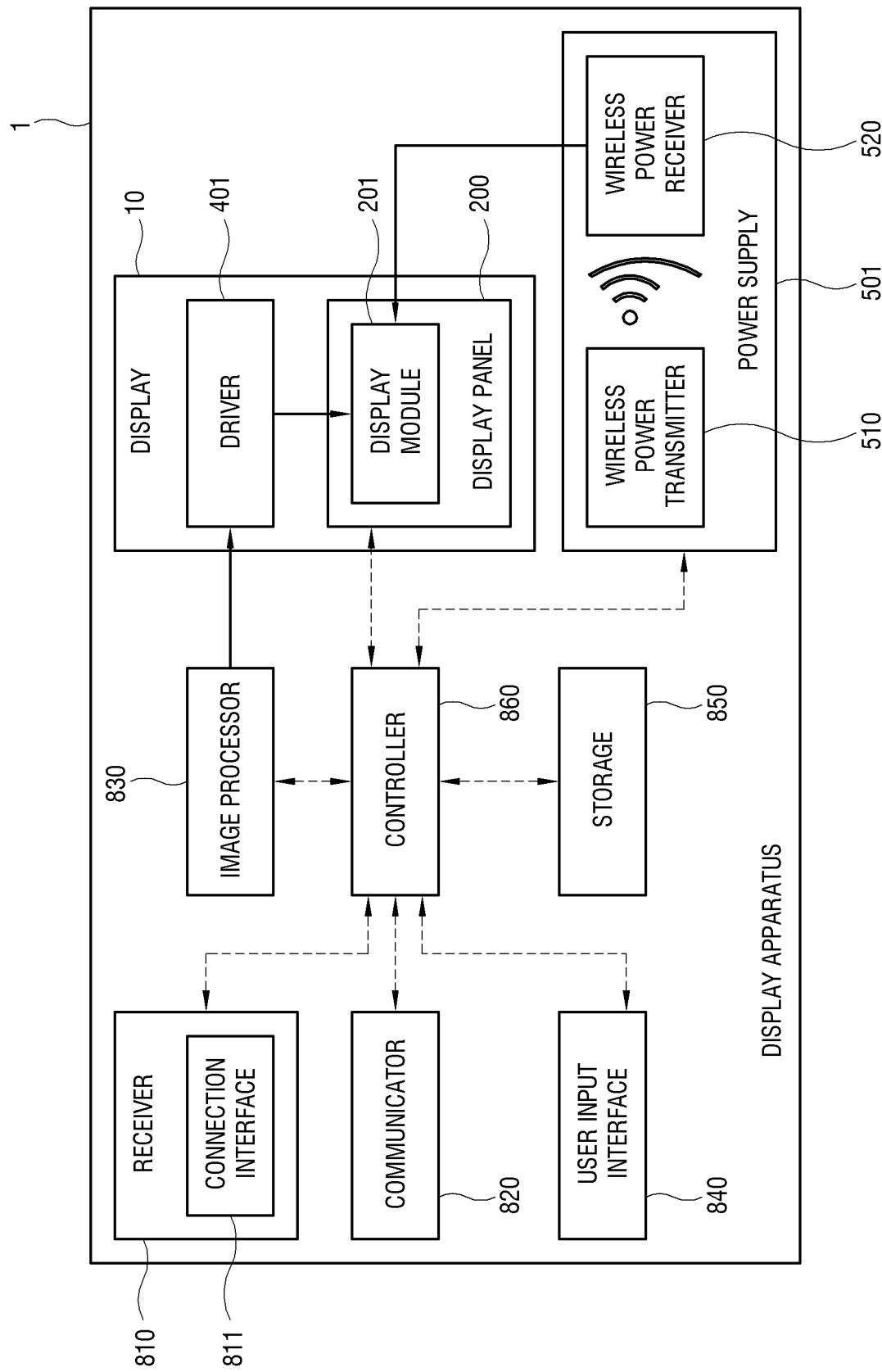
FIG. 13 is a block diagram showing a configuration of a display apparatus according to an embodiment.

FIG. 13 is a block diagram showing a configuration of a display apparatus according to an embodiment.

The display apparatus 1 according to an embodiment, as shown in FIG. 13, includes a display 10, a power supply 500, a receiver 810, a communicator 820, an image processor 830, a user input interface 840, a storage 850, and a controller 860. Here, the receiver 810, the communicator 820, the image processor 830, the user input interface 840, the storage 850, and the controller 860 are for example provided in the main body 11 shown in FIG. 1, but embodiments are not limited thereto.

The display 10 includes the display panels 200 and 300 including the plurality of display modules 201~216 and 301~308 as shown in FIGS. 2 and 3. FIG. 13 shows one display module 201 among the plurality of display modules of the display 10 according to an embodiment by way of example.

The display 10 further include a driver 401 configured to drive the plurality of display modules 201~216, 301~308. The display apparatus 1 according to an embodiment is provided with the plurality of drivers (see '401~416' of FIG.

6), which drive one or more corresponding display modules, and FIG. 13 shows one driver 401 among the plurality of drivers by way of example.

According to the disclosure, there are no limits to the number or array of drivers. For example, the plurality of drivers 401~416 may, as shown in FIG. 6, be configured to respectively drive the plurality of corresponding display modules 201~216, or the plurality of drivers may alternatively be configured to drive the plurality of display modules 301~308 included in the corresponding module groups 300-1~300-16.

According to an embodiment, the drivers 401~416 may be provided in timing controllers, i.e., T-con boards that process image data and generate a timing control signal to drive the corresponding display modules. For example, the display 10 may be provided with the T-con boards corresponding to the display modules 201~216, and the T-con boards may be respectively mounted with the plurality of drivers 401~416 corresponding to the plurality of display modules 201~216. Alternatively, the display 10 is provided with the T-con boards according to the module groups 300-1~300-16, and the T-con boards may be respectively mounted with the plurality of drivers corresponding to the plurality of module groups 300-1~300-16.

The display apparatus 1 according to an embodiment may, as shown in FIGS. 5 and 6, be provided with the plurality of power supplies 501~516, and FIG. 13 shows an example of one power supply 501 among the plurality of power supplies 501~516 according to an embodiment.

The power supplies 501~516 include the wireless power transmitter 510 receiving power and wirelessly transmitting power, and the wireless power receiver 520 wirelessly receiving power from the wireless power transmitter and outputting power to one or more corresponding display modules.

The receiver 810 receives content from the image source. The receiver 810 includes a tuner to be tuned to a channel for a broadcast signal.

The receiver 810 includes a connection interface 811 through which the display apparatus 1 is connected to an external image source by a wire. The display apparatus 1 may receive content from the image source such as a set-top box through the connection interface 811 connected by the wire.

The connection interface 811 may be embodied as a communication circuitry including a data input/output interface where communication modules (an S/W module, a chip, etc.), ports, etc., corresponding to various kinds of communication protocols are combined.

The connection interface 811 basically receives a signal from an image source, but may be provided to interactively transmit and receive a signal.

According to an embodiment, the connection interface 811 is connected to the image source through an HDMI cable, but the connection method is not limited to the HDMI. Further, the display apparatus 1 and the image source may be connected by a wire or wirelessly through the communicator 820 to be described later.

According to an embodiment, an apparatus connected to the display apparatus 1 by a wire through the connection interface 811 becomes an image source such as a set-top box, a PC, etc., but the disclosure is not limited to this. For example, according to an alternative embodiment, the display apparatus 1 may be connected to a mobile apparatus by a wire through the connection interface 811.

The communicator 820 performs wired or wireless communication with at least one external apparatus including an image source. The display apparatus 1 may receive content from the image source through the communicator 820.

The communicator 820 may be embodied as a communication circuitry including wired or wireless communication modules (an S/W module, a chip, etc.) corresponding to various kinds of communication protocols.

According to an embodiment, the communicator 820 includes a wireless local area network (WLAN) interface. The WLAN interface may be wirelessly connected to an external apparatus through an access point (AP) under control of the controller 860. The WLAN interface includes a Wi-Fi communication module.

According to an embodiment, the communicator 820 includes a short-range communication module wirelessly supporting direct communication between the display apparatus 1 and the external apparatus without the AP. The short-range communication module may include at least one among Wi-Fi Direct, Bluetooth, Bluetooth low energy, radio frequency (RF) communication, infrared data association (IrDA), Zigbee, Ultra-Wideband (UWB), and near-field communication (NFC).

When the display apparatus 1 performs direct communication with an external apparatus, the storage 850 may be configured to store address information about the external apparatus targeted for communication (for example, a media access control (MAC) address or an Internet protocol (IP) address).

In the display apparatus 1 according to an embodiment, the communicator 820 may be configured to perform wireless communication with the external apparatus through at least one of the WLAN interface and the short-range communication module according to performance.

According to an alternative embodiment, the communicator 820 may include a wired communication module such as Ethernet, etc. According to an alternative embodiment, the communicator 820 may further include at least one communication module based on various communication methods such as long-term evolution (LTE) and the like mobile communication, electromagnetic (EM) communication including a magnetic field, visible light communication, acoustic telecommunication, etc.

According to an embodiment, the display apparatus 1 may receive video content from an external server and the like image source by a real-time streaming method through the communicator 820. For example, the display apparatus 1 may receive content by a streaming method through Netflix, YouTube, etc.

The image processor 830 performs various preset video/audio processing with regard to an image signal of content. The image processor 280 outputs an image signal generated or combined by such processing to the display 10, so that an image based on the image signal can be displayed on the display panel 200. The image signal processed in the image processor 830 may be based on data stored in a flash memory, a hard disk drive, or the like nonvolatile storage 850.

The image processor 830 includes a video decoder for decoding an image signal to have an image format of the display apparatus 1, and a scaler for adjusting the image signal to correspond to the output standards of the display panel 200.

According to an embodiment, the decoder may for example be embodied by an H. 264 decoder, but embodiments are not limited thereto. For example, the video decoder in this embodiment may for example be embodied as a moving picture experts group (MPEG) decoder, a high efficiency video codec (HEVC) decoder, or the like decoders corresponding to various compression standards.

Further, there are no limits to the kinds of content to be processed by the image processor 830 according to the disclosure. For example, the content to be processed by the image processor 830 may include not only a moving picture like a video, but also a still picture such as a picture of joint photographic experts group (JPEG) file, a background image, etc.

The content to be processed by the image processor 830 may include content data corresponding to a display image according to its kinds, and meta-data as its appended information.

Here, there are no limits to the kinds of video processing process performed in the image processor 830. For example, the image processor 830 may for example perform at least one of various processes such as de-interlacing for converting an interlaced broadcast signal into a progressive broadcast signal, detail enhancement, frame refresh rate conversion, line scanning, etc.

The image processor 830 may be embodied by a group of individual components for independently performing such processes, or may be embodied as included in a main system-on-chip (SoC) where various functions are integrated. The main SoC may further include at least one microprocessor or central processing unit (CPU) as an example of the controller 860 (to be described later).

According to an embodiment, the image processor 830 may be embodied by a video board including circuit elements such as various chipsets a memory, electronic parts, wirings, etc., for performing the processes, which are mounted on to a printed circuit board (PCB). In this case, the image processor 830 and the controller 860 of the display apparatus 1 may be provided on a single video board. Of course, this is merely an example, and they may be arranged on a plurality of PCBs connecting and communicating with each other.

According to an embodiment, the image processor 830 may output a signal to at least one driver among the plurality of drivers 401~416 provided in the display 10. Here, the output signal refers to area information about a screen area to display an image on the display panel 200, and may further include identification information about at least one display module to display the image.

The controller 860 may control the image processor 830 to output a signal to the driver 410 corresponding to at least one display module, which corresponds to a certain area of the display 10 to display the image, among the plurality of display modules. The driver 410 may selectively drive the corresponding display module based on a signal received from the image processor 830, thereby displaying an image on the screen area (some areas) of the driven display module.

Further, the controller 860 may control at least one corresponding power supply 501 to supply power to at least one display module corresponding to a certain area of the display 10 for displaying an image. Therefore, the image can be displayed on the screen area of the display module that receives power.

In response to a user's input, the user input interface 840 transmits various preset control commands or unrestricted information to the controller 860. The user input interface 840 may include a power key provided on an outer surface of the display apparatus 1, and a keypad (or an input panel) including a menu key or the like button.

According to an embodiment, the user input interface 840 includes an input device to generate preset command/data/information/signal for remotely controlling the display apparatus 1 and transmit it to the display apparatus 1.

The input device is configured to receive a user's input as separated from the display apparatus 1 like a remote controller. The remote controller may include at least one of a touch sensor for receiving a user's touch input, or a motion sensor for sensing its own motion caused by the user.

The input device includes a terminal such a smartphone installed with a remote-control application. In this case, it is possible to receive a user's touch input through a touch screen.

The input device may transmit a signal through wireless communication with the display apparatus 1, and the wireless communication may employ at least one among Bluetooth, IrDA, RF communication, WLAN, and Wi-Fi direct.

According to an embodiment, the user input interface 840 may further include a voice input interface to receive a voice/sound uttered by a user. The voice input interface may be embodied by a microphone to receive a voice signal, and may be installed in the main body 11, the remote controller, etc.

The storage 850 is configured to store various pieces of data of the display apparatus 1. The storage 850 may be embodied by a nonvolatile memory (e.g., a writable read only memory (ROM)) in which data is retained even though power supplied to the display apparatus 1 is cut off, and which writes and reflects changes. For example, the storage 850 may be provided as at least one of a flash memory, an erasable and programmable read only memory (EPROM), or an electrically erasable and programmable read only memory (EEPROM). The storage 850 may further include a volatile memory such as a dynamic random-access memory (DRAM) or a static SRAM, of which the reading or writing speed of the display apparatus 1 is faster than that of the nonvolatile memory.

Data stored in the storage 850 may for example include not only an operating system for driving the display apparatus 1 but also various pieces of software, programs, applications, image data, appended data, etc., which can run on the operation system.

The storage 850 may be configured to store graphic data provided by the display apparatus 1 itself. The graphic data may be output to the display 10 as a signal processed by the image processor 830, and displayed as graphics such as an on-screen display (OSD), a graphic user interface (GUI, hereinafter, also referred to as a user interface (UI)), etc., on a certain area of the screen of the display panel 200. Here, the output signal refers to area information about an area of the screen for displaying the graphics, and may further include identification information about the display module for displaying the graphics.

The controller 860 performs control for operating overall elements of the display apparatus 1. The controller 860 executes a control program (or an instruction) to perform such control. The controller 860 may include at least one of general-purpose processor that loads at least a part of a control program from a nonvolatile memory installed with the control program to a volatile memory and executes the loaded control program, and may be embodied by a CPU, an application processor (AP) or a microprocessor.

The processor may include a single-core processor, a dual-core processor, a triple-core processor, a quad-core processor, and the like multiple-core processor. The processor 16 may include a plurality of processors, for example, a main processor and a sub processor that operates in a sleep mode (e.g., receiving only standby power without operating as a display apparatus). Further, the processor, the ROM and the RAM are connected to one another via an internal bus, and the ROM and the RAM are included in the storage 850.

The processor, as an example of the controller 860 according to the disclosure, may be embodied as included in the main SoC mounted to a built-in PCB of the display apparatus 1. According to an alternative embodiment, the main SoC may further include the image processor 830.

The control program may include a program (s) achieved in the form of at least one among a basic input/output system (BIOS), a device driver, an operating system, a firmware, a platform, and an application. According to an embodiment, the application may be previously installed or stored in the display apparatus 1 when the display apparatus 1 is manufactured, or may be installed in the display apparatus 1 for use in the future on the basis of data received corresponding to the application from the outside. The data of the application may for example be downloaded from an external server such as an application market (or App store) to the display apparatus 1. Such an external server is an example of a computer program product, but embodiments are not limited thereto.

According to an embodiment, the operations of the controller 860 may be carried out by a computer program stored in a computer program product provided separately from the display apparatus 1. In this case, the computer program product may include a memory storing instructions corresponding to the computer program, and a processor.

Therefore, the display apparatus 1 may download and execute the computer program stored in a separate computer program product, thereby performing the operations of the controller 860.

According to an alternative embodiment, the load sharing structure may be expanded to be applied to the display apparatus including a plurality of foldable-screen type displays.

Figure 14:
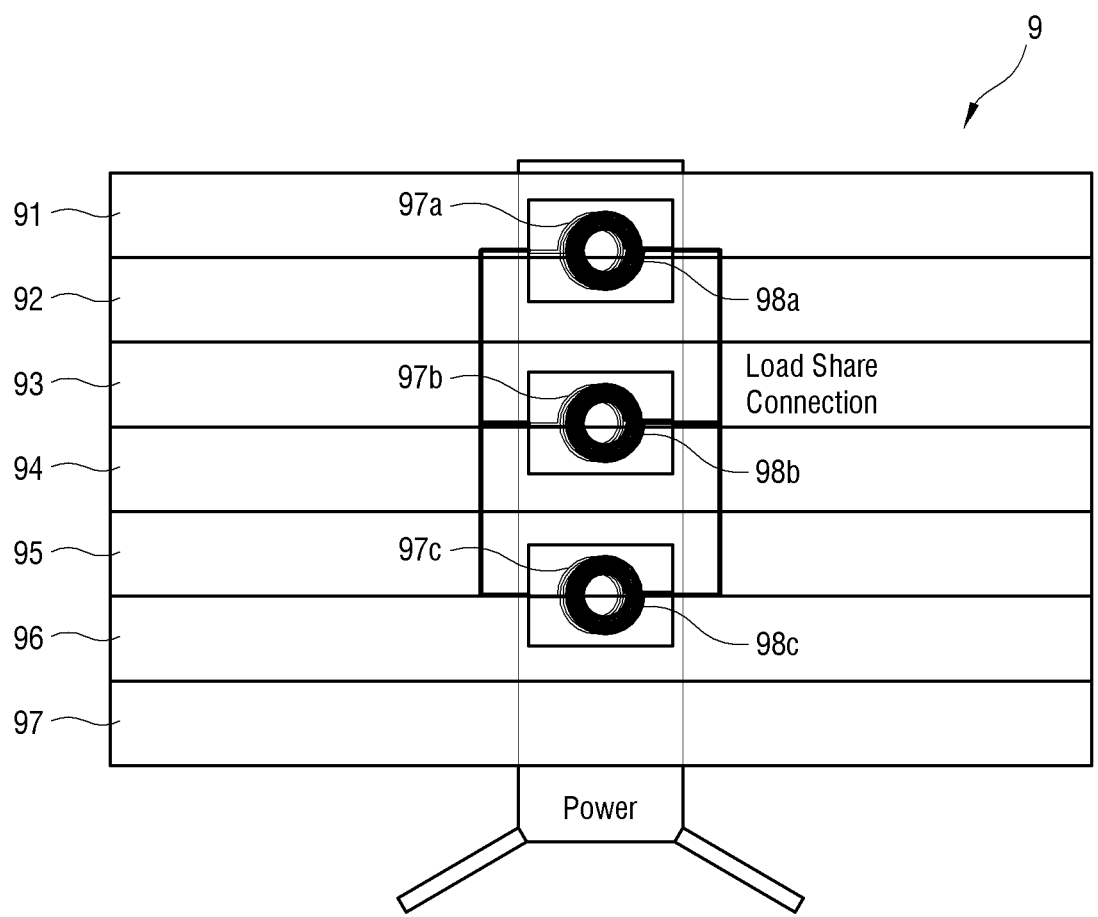
FIG. 14 schematically illustrates a load sharing structure of a display apparatus according to another embodiment.

FIG. 14 schematically illustrates a load sharing structure of a display apparatus according to another embodiment.

FIG. 14 shows a display apparatus 9 that include a plurality of foldable displays 91~96, and a sound output interface 97 provided on the bottom thereof. Here, the plurality of displays 91~96 may enable the whole display to be foldable in the form of a so-called window shade.

The display apparatus 9 includes a plurality of power supplies, which includes a plurality of transmission coils 97a, 97b and 97c and a plurality of reception coils 98a, 98b and 98c for the wireless power transfer, in the back thereof, and the load sharing structure is applied a connector 99 to the output terminals of the plurality of reception coils 98a, 98b and 98c. Therefore, as described in the embodiments, the loads of the displays 91~96 are shared, i.e., allotted between the plurality of power supplies.

While embodiments have been particularly shown and described, it will be understood that various changes in form and details may be made therein without departing from the spirit and scope of the following claims.

What is claimed is:

1. A display apparatus comprising:
 a display comprising a plurality of display modules, each of which comprises a plurality of light emitting devices;
 a plurality of wireless power transmitters configured to wirelessly transmit power;
 a plurality of wireless power receivers configured to receive the power from the plurality of wireless power transmitters, the plurality of wireless power receivers respectively corresponding to the plurality of display modules, and comprising output terminals configured to output the power to the plurality of display modules; and
 a connector connecting the output terminals of the plurality of wireless power receivers to each other.

2. The display apparatus according to claim 1, wherein the connector connects the output terminals of two or more wireless power receivers among the plurality of wireless power receivers, and
 wherein power consumed in two or more display modules is distributed and shared by two or more power supplies provided in the two or more wireless power receivers of which the output terminals are connected.

3. The display apparatus according to claim 2, further comprising a plurality of direct current (DC)/DC controllers respectively connected to the output terminals of the plurality of wireless power receivers and configured to adjust a level of voltage applied to the plurality of display modules, and a load share controller configured to feed a signal back to the plurality of DC/DC controllers based on load states of the two or more display modules.

4. The display apparatus according to claim 1, wherein each of the plurality of wireless power transmitters comprises a transmission coil configured to generate a magnetic field, and
 wherein each of the plurality of wireless power receivers comprises a reception coil disposed to face a corresponding transmission coil and configured to wirelessly receive the power from the corresponding transmission coil.

5. The display apparatus according to claim 4, wherein each of the plurality of wireless power receivers further comprises:
 a rectifier configured to rectify and convert alternating current (AC) power received through the reception coil into DC power; and
 a DC/DC converter configured to regulate and supply DC power received from the rectifier to a corresponding display module.

6. The display apparatus according to claim 4, wherein each of the plurality of wireless power transmitters further comprises:
 an input power interface configured to receive external AC power and covert the external AC power into DC power; and
 an inverter configured to convert the DC power output from the input power interface into AC power and provide the AC power to the transmission coil.

7. The display apparatus according to claim 4, further comprising:
 a rear cabinet; and
 a front cabinet,
 wherein the transmission coil is provided in the rear cabinet, and the reception coil is accommodated in the front cabinet, and
 wherein the front cabinet is configured to couple with the rear cabinet.

8. The display apparatus according to claim 7, wherein the connector is provided in one of the rear cabinet or the front cabinet.

9. The display apparatus according to claim 7, further comprising a coupling interface configured to provide a physical connection and an electrical connection between the front cabinet and the rear cabinet.

10. The display apparatus according to claim 1, wherein the connector comprises a cable connecting the output terminals of two or more wireless power receivers among the plurality of wireless power receivers.

11. A display apparatus comprising:
a display comprising a plurality of display modules, each of which comprises a plurality of light emitting devices;
a first power supply comprising:
   a first wireless power transmitter configured to wirelessly transmit power;
   a first wireless power receiver configured to receive the power from the first wireless power transmitter;
   a first output terminal configured to provide the power to at least one display module among the plurality of display modules; and
   a first direct current (DC)/DC converter connected between the first wireless power receiver and the first output terminal;
a second power supply comprising:
   a second wireless power transmitter configured to wirelessly transmit the power;
   a second wireless power receiver configured to receive the power from the second wireless power transmitter;
   a second output terminal configured to provide the power to at least one display module among the plurality of display modules; and
   a second DC/DC converter connected between the second wireless power receiver and the second output terminal;
wherein the first output terminal is electrically connected to the second output terminal.

12. A display apparatus comprising:
a display comprising a plurality of display modules, each of which comprises a plurality of light emitting devices;
a first power supply comprising:
   a first wireless power transmitter configured to wirelessly transmit power;
   a first wireless power receiver configured to receive the power from the first wireless power transmitter; and
   a first output terminal configured to provide the power to at least one display module among the plurality of display modules;
a second power supply comprising:
   a second wireless power transmitter configured to wirelessly transmit the power;
   a second wireless power receiver configured to receive the power from the second wireless power transmitter; and
   a second output terminal electrically connected to the first output terminal, and configured to provide the power to at least one display module among the plurality of display modules,
a first direct current (DC)/DC controller connected to the first output terminal and the second output terminal;
a second DC/DC controller connected to the first output terminal and the second output terminal;
a first load share controller configured to feed a first signal back to the first DC/DC controller based on load states of all the one or more display modules provided with the power by the first output terminal; and
a second load share controller configured to feed a second signal back to the second DC/DC controller based on load states of all the one or more display modules provided with the power by the second output terminal,
wherein the first DC/DC controller and the second DC/DC controller are configured to adjust a level of voltage applied to the corresponding display modules.

13. The display apparatus according to claim 11, wherein each of the first wireless power transmitter and the second wireless power transmitter comprises a transmission coil configured to generate a magnetic field, and
wherein each of the first wireless power receiver and the second wireless power receiver comprises a reception coil disposed to face a corresponding transmission coil and configured to wirelessly receive the power from the corresponding transmission coil.

14. The display apparatus according to claim 13, wherein the transmission coil of each of the first wireless power transmitter and the second wireless power transmitter is provided in a rear cabinet of the display apparatus,
wherein the reception coil of each of the first wireless power receiver and the second wireless power receiver is provided in a front cabinet of the display apparatus, and
wherein the front cabinet is configured to couple with the rear cabinet.

15. The display apparatus according to claim 14, wherein one of the rear cabinet or the front cabinet comprises a connector connecting the first output terminal and the second output terminal.

16. The display apparatus according to claim 1, further comprising a plurality of direct current (DC)/DC controllers respectively connected to the output terminals of the plurality of wireless power receivers.

17. The display apparatus according to claim 16, further comprising a load share controller configured to feed a signal back to the plurality of DC/DC controllers based on load states of the plurality of display modules.

18. The display apparatus according to claim 11, further comprising a first load share controller configured to feed a first signal back to control the first DC/DC converter based on load states of all the one or more display modules provided with the power by the first output terminal.

19. The display apparatus according to claim 18, wherein the first DC/DC controller is configured to adjust a level of voltage applied to the one or more display modules provided with the power by the first output terminal.

20. The display apparatus according to claim 18, further comprising a second load share controller configured to feed a second signal back to control the second DC/DC converter based on load states of all the one or more display modules provided with the power by the second output terminal.

* * * * *